(12) United States Patent
Wang (10) Patent No.: US 11,688,413 B2
(45) Date of Patent: Jun. 27, 2023

(54) METHOD AND SYSTEM FOR AUDIO RECOGNITION OF ARCING DURING SEMICONDUCTOR PROCESS

(71) Applicant: Taiwan Semiconductor Manufacturing Co., Ltd., Hsinchu (TW)

(72) Inventor: Chih-Yu Wang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/721,684

(22) Filed: Dec. 19, 2019

(65) Prior Publication Data

US 2021/0193166 A1    Jun. 24, 2021

(51) Int. Cl.
| | |
|---|---|
| *G10L 25/51* | (2013.01) |
| *G06N 20/00* | (2019.01) |
| *H01L 21/67* | (2006.01) |
| *H01L 21/66* | (2006.01) |
| *H04R 1/40* | (2006.01) |
| *H04R 3/00* | (2006.01) |
| *H04R 3/04* | (2006.01) |

(52) U.S. Cl.
CPC ............ *G10L 25/51* (2013.01); *G06N 20/00* (2019.01); *H01L 21/67017* (2013.01); *H01L 21/67253* (2013.01); *H01L 22/26* (2013.01); *H04R 1/406* (2013.01); *H04R 3/007* (2013.01); *H04R 3/04* (2013.01)

(58) Field of Classification Search
CPC ... G10L 25/51; G06N 20/00; H01L 21/67017; H01L 21/67253; H01L 22/26; H04R 1/406; H04R 3/007; H04R 3/04

USPC .......................................................... 381/56
See application file for complete search history.

(56) References Cited

U.S. PATENT DOCUMENTS

| | | | |
|---|---|---|---|
| 6,332,961 B1* | 12/2001 | Johnson ............ | H01J 37/32174 204/192.12 |
| 6,753,499 B1* | 6/2004 | Yasaka ................... | G01N 29/14 374/117 |
| 10,692,705 B2 | 6/2020 | Mihaylov et al. | |
| 2009/0091441 A1* | 4/2009 | Schweitzer, III ... | G01M 13/028 340/531 |

(Continued)

FOREIGN PATENT DOCUMENTS

| | | |
|---|---|---|
| JP | 2003-100714 A | 4/2003 |
| JP | 2007-3443 A | 1/2007 |
| KR | 20020029328 A | 4/2002 |

(Continued)

*Primary Examiner* — Paul Kim
*Assistant Examiner* — Douglas J Suthers
(74) *Attorney, Agent, or Firm* — Seed IP Law Group (57) ABSTRACT

An arcing detection system detects arcing within a semiconductor processing cleanroom environment. The arcing detection system includes an array of microphones positioned within the cleanroom environment. The microphones receive soundwaves within the cleanroom environment and generate audio signals based on the sound waves. The arcing system includes a control system that receives the audio signals from the microphones. The control system analyzes the audio signals and detects arcing within the cleanroom environment based on the audio signals. The control system can adjust a semiconductor process in real time responsive to detecting arcing.

20 Claims, 7 Drawing Sheets

(56) References Cited

U.S. PATENT DOCUMENTS

2009/0153144 A1* 6/2009 Hansen .................. G01R 31/00
 324/511
2017/0140905 A1* 5/2017 Mihaylov ......... H01J 37/32944

FOREIGN PATENT DOCUMENTS

| KR | 20180073700 A | 7/2018 |
| KR | 101889834 B1 | 8/2018 |
| TW | 201728880 A | 8/2017 |
| WO | 99/14394 A1 | 3/1999 |

* cited by examiner

METHOD AND SYSTEM FOR AUDIO RECOGNITION OF ARCING DURING SEMICONDUCTOR PROCESS

BACKGROUND

Technical Field

The present disclosure relates to the field of semiconductor processing. The present disclosure relates more particularly to detecting arcing during a semiconductor process.

Description of the Related Art

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, vias, plugs, and other integrated circuit structures and components.

During various semiconductor processes, it is possible that electrical arcing will occur within the processing environment. The electrical arcing may damage semiconductor wafers. The result is that the damaged semiconductor wafers may need to be discarded.

DETAILED DESCRIPTION

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
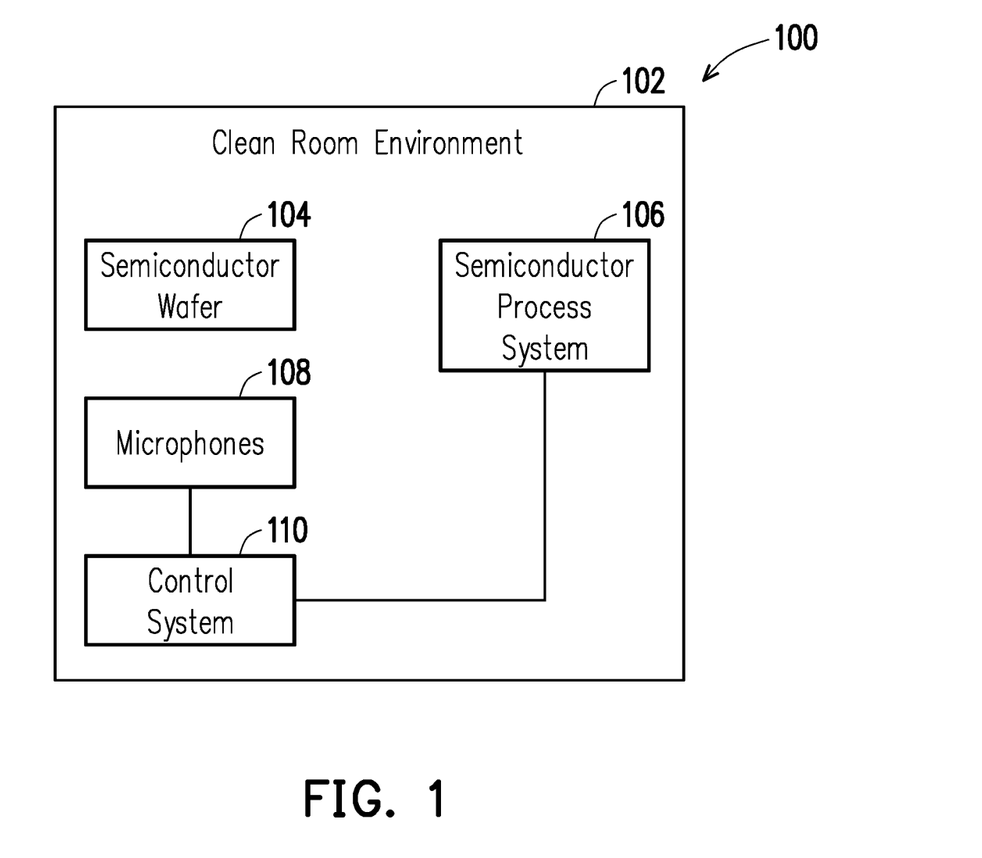
FIG. 1 is a block diagram of an arcing detection system, according to one embodiment.

FIG. 1 is a block diagram of an arcing detection system 100, according to an embodiment. The arcing detection system 100 includes an array of microphones 108 positioned within a semiconductor processing cleanroom environment 102. The arcing detection system 100 includes a control system 110 communicatively coupled to the microphones 108. The microphones 108 and the control system 110 cooperate together to detect arcing within the cleanroom environment 102.

The cleanroom environment 102 is utilized to perform semiconductor processing on a semiconductor wafer 104. The semiconductor processing results in the formation of a plurality of integrated circuits within the semiconductor wafer 104. After semiconductor processing is complete, the semiconductor wafer 104 can be diced in order to separate individual integrated circuit dies from the semiconductor wafer 104.

The semiconductor processes can include the deposition or growth of semiconductor layers, dielectric layers, metal layers, and other features on or in the semiconductor wafer 104. The semiconductor processes can include photolithography processes for patterning features of the various materials deposited or grown on the semiconductor wafer 104. The semiconductor processes can include etching processes for removing material in conjunction with the photolithography processes for patterning the various materials deposited or grown on the semiconductor wafer 104. The semiconductor processes can include ion implantation processes for implanting dopant species in the semiconductor wafer 104. The semiconductor processes can also include cleaning, planarization, and annealing steps. Other semiconductor processes can be performed without departing from the scope of the present disclosure.

The semiconductor process system 106 controls the various semiconductor processes performed on the semiconductor wafer 104 within the cleanroom environment 102. The semiconductor process system 106 can include chemical vapor deposition systems, physical vapor deposition systems, wet etch systems, dry etch systems, annealing systems, ion implantation systems, photolithography systems, and other systems suitable for performing semiconductor processing on the semiconductor wafer 104. The semiconductor process system 106 can include components positioned within the cleanroom environment 102 and components positioned external to the clean environment 102. The semiconductor process system 106 can include power sources that generate electric fields within the clean environment 102 or that apply voltages within the cleanroom environment 102. The semiconductor process system 106 can include control systems that control the semiconductor processes performed by the semiconductor process system 106.

While performing processing steps on the semiconductor wafer 104, electrical arcing may occur within the cleanroom environment 102. Arcing is the momentary flow of high electrical current within the cleanroom environment 102. The arcing can occur due to the buildup of electrostatic charge between objects or materials within the cleanroom environment 102. Electrostatic charges can build up on walls of the cleanroom environment 102, on process equipment within the cleanroom environment 102, in gases present within the cleanroom environment 102, or in other ways. When an electric field becomes large enough due to the buildup of electrostatic charge, or due to other factors, arcing can occur.

If arcing occurs in the vicinity of the semiconductor wafer 104, it is possible that the semiconductor wafer 104 will be damaged. For example, if arcing results in the flow of large currents between a portion of the semiconductor wafer 104 and another object or material within the cleanroom environment 102, then the currents can damage the semiconductor wafer 104. If the semiconductor wafer 104 is damaged, it is possible that some integrated circuit dies that result from the semiconductor wafer 104 will not function properly. In some cases, the semiconductor wafer 104 may be sufficiently damaged that the entire semiconductor wafer 104 will need to be discarded. This results in a significant loss of time, materials, and money.

The arcing detection system 100 of FIG. 1 is able to detect and control arcing in the cleanroom environment 102 in real time. The arcing detection system 100 of FIG. 1 utilizes the microphones 108 and the control system 110 to detect and control arcing within the clean environment 102.

Arcing results in the generation of sound waves. The sound waves are characteristic of the arcing. Furthermore, different types of arcing between various materials results in different types of sounds. Accordingly, the arcing detection system 100 detects arcing based on the sounds that result from arcing.

The arcing detection system utilizes an array of microphones 108 to detect sounds that result from arcing. The array of microphones 108 is arranged so that the microphones 108 are positioned in various locations within the cleanroom environment 102. The microphones 108 are arranged to enable detection of arcing sounds in various locations within the cleanroom environment 102.

In one embodiment, the microphones 108 are positioned within the cleanroom environment 102 to enable detection of a location of arcing within the clean environment 102. If the microphones are positioned at various selected locations, then the characteristics of the sound detected by each microphone can be utilized to determine the location of the arcing within the clean environment 102. For example, the amplitude of the arcing sound detected by each microphone, taking into account the position of each microphone within the cleanroom environment 102, enables identification of the exact location of arcing within the cleanroom environment 102.

The microphones 108 generate audio signals responsive to the sound waves encountered by the microphones 108. The audio signals correspond to electrical signals representative of the sounds received by the microphones 108.

The microphones 108 include microphones that are sensitive to various soundwave frequency ranges. Some of the microphones 108 are sensitive to sound waves that are audible to the human ear. For example, most humans can hear sounds within a range of 50 Hz to 20,000 Hz. Some of the microphones are sensitive to sound waves within this range, or subsets of soundwaves within this range.

In one embodiment, some of the microphones 108 are sensitive to ultrasonic soundwaves. Ultrasonic soundwaves correspond to soundwaves having frequencies that are higher than frequencies that can typically be heard by the human ear. Some of the microphones 108 are sensitive to soundwaves between a range of 20 kHz and 20 MHz. Some of the microphones 108 may be sensitive to various subsets of frequencies between 20 kHz and 20 MHz.

In one embodiment, some of the microphones 108 are sensitive to infra-sonic soundwaves. Infrasonic soundwaves correspond to soundwaves having frequencies that are lower than frequencies that can typically be heard by the human ear. Accordingly, some of the microphones 108 are sensitive to soundwaves between a range of 0 Hz and 100 Hz. Some of the microphones 108 can be sensitive to various subsets of frequencies between 0 Hz and 100 Hz.

In one embodiment, some of the microphones 108 are in contact with semiconductor processing equipment positioned within the cleanroom environment 102. For example, some of the microphones 108 may be positioned in contact with a carrier or other object on which the semiconductor wafer 104 is positioned during processing. Such microphones can assist in determining if the carrier or other object, or the semiconductor wafer 104 itself, has been impacted by arcing.

The control system 110 is communicatively coupled to the microphones 108. In particular, the control system 110 receives the audio signals from the microphones 108. The control system 110 processes the audio signals and determines whether arcing has occurred within the cleanroom environment 102 based on the audio signals.

The control system 110 can receive the audio signals wirelessly from the microphones 108. The microphones 108 may be coupled to the control system 110 by one or more wireless connection protocols including, but not limited to Bluetooth, Wi-Fi, or Zigbee protocols. Other wireless communication protocols can be utilized without departing from the scope of the present disclosure. Accordingly, the arcing detection system 100 can include wireless transceivers or transmitters coupled to the microphones 110 positioned within the cleanroom environment 102. The wireless transceivers or transmitters can transmit the audio signals to the control system 110.

In one embodiment, the arcing detection system 100 includes power sources coupled to the microphones 108 and, if present, to the wireless communication systems coupled to the microphones 108. The power sources can include batteries or wired connections to stable power supplies. In one embodiment, the arcing detection system 100 includes energy harvesting devices for recharging batteries or for otherwise powering the microphones 108 and the wireless communication systems. The energy harvesting devices can harvest energy from soundwave vibrations or other types of motion.

In one embodiment, the microphones 108 are connected to the control system 110 by a wired connection. Accordingly, the microphones 108 can communicate with the control system 110 via a wired connection that passes to the control system 110.

The microphones 108 may initially generate analog audio signals. The analog audio signals may be provided to the control system 110. In some cases, the audio signals may first be converted from analog audio signals to digital audio signals prior to being passed to the control system 110. However, as described herein, providing audio signals to the control system 110 can include providing audio signals that have been digitized or otherwise adjusted. Accordingly, providing audio signals to the control system 110 can include providing signals that are based on the audio signals generated by the microphones 108.

In one embodiment, when the control system 110 receives audio signals from the microphones 108, the control system 110 may filter the audio signals. Accordingly, the control system 110 can include one or more filters. The audio signals are passed to the filters in order to remove background noise. The filters may also remove audio signals that fall within certain frequency bands. After the audio signals have been passed through the one or more filters, the audio signals are ready for further processing and analysis by the control system 110.

In one embodiment, the audio signals can be passed through filters prior to being transmitted to the control system 110. Accordingly, the microphones 108 can be coupled to one or more electrical filters or other circuitry to reduce noise prior to transmitting the audio signals to the control system 110. This enables the control system 110 to more readily identify arcing based on the audio signals.

In one embodiment, the control system 110 identifies arcing by analyzing the audio signals in a time domain. Accordingly, the control system 110 performs time domain analysis on the audio signals in order to identify waveforms that are characteristic of arcing within the cleanroom environment 102.

In one embodiment, the control system 110 identifies arcing by analyzing the audio signals in the frequency domain. Accordingly, the control system 110 can perform frequency domain analysis on the audio signals 110. The frequency domain analysis can include performing a Fourier transform on the audio signals. The Fourier transform takes audio signals from the time domain and provides a frequency domain representation of the audio signals. The frequency domain analysis can assist in identifying sounds that are characteristic of arcing within the cleanroom environment 102. The Fourier transform can include a fast Fourier transform, a discrete Fourier transform, or other types of Fourier transforms. The frequency domain analysis can include performing wavelet analysis on the audio signals. In one embodiment, the control system 110 uses a combination of time domain analysis and frequency domain analysis to identify arcing from the audio signals.

In one embodiment, the control system 110 includes an analysis model. The analysis model is trained with a machine learning process in order to identify arcing within the cleanroom environment 102. The analysis model can analyze the audio signals, or signals based on the audio signals, in order to identify arcing within the cleanroom environment 102.

In one embodiment, the machine learning process is a supervised machine learning process. Supervised machine learning processes are typically distinguished from unsupervised machine learning processes by the use of labels in the learning process. For example, if a machine learning process trains an analysis model to classify data items as belonging to one of a plurality of possible categories, a supervised machine learning process will include labeled data items. The labeled data items are the training set for the machine learning process. The label for a data item indicates the correct category for that data item. The supervised machine learning process trains the analysis model to classify the data items in a way that matches the labels. In this way, the machine learning process is a supervised process.

The supervised machine learning process for the analysis model of the control system 110 can include generating training set data. Generating the training set data can include gathering audio signals from known arcing events. Generating the training set data can include gathering audio signals known to not include arcing sounds. The training set data can be labeled to identify audio signals that represent arcing, and audio signals that do not represent arcing.

The known arcing events for the training set data can include various types of arcing events including arcing between various objects or positions within the clean environment 102. The known arcing events can also include arcing that contacts the semiconductor wafer 104 or equipment that holds or supports the semiconductor wafer 104.

The training set data can include audio signals in the time domain and in the frequency domain. The training set data can include audio signals after various frequency domain transformations including fast Fourier transforms, discrete Fourier transforms, wavelet transforms or other types of frequency domain transforms.

The supervised machine learning process can include passing the training set data through the analysis model. The analysis model classifies each audio signal from the training set as either an arcing event or a non-arcing event. The classifications are then compared to the labels. The parameters or weights of one or more classification functions of the analysis model are adjusted and the audio signals of the training set are passed through the analysis model again. The classifications are then compared to the labels and the functions are adjusted accordingly. This process repeats in iterations until the analysis model is able to reliably classify the audio signals in a way that matches the labels.

In one embodiment, the audio signals are converted to a vector form prior to being passed to the analysis model. Accordingly, the analysis model analyzes a vectorized representation of the audio signals in one or both of the time domain and the frequency domain. Thus, analyzing the audio signals with the analysis model can include analyzing vectorized versions of the audio signals or other types of representations of the audio signals.

In one embodiment, the analysis model includes a classifier model, a multiclass classifier model, or a binary classifier model. The analysis model can include a neural network based classifier model. The classifier model can include a logistic regression model, a naïve Bayes model, a stochastic gradient descent model, a K nearest neighbors model, a decision tree model, a random forest model, or other types of classifier models. The analysis model can also include other types of classifier models or models other than classifier models without departing from the scope of the present disclosure.

In one embodiment, the analysis model includes an unsupervised machine learning model. Unsupervised machine learning processes typically do not include labeled data. Thus, a training set for an unsupervised learning process includes data items for which there are not labels available. The unsupervised machine learning processes can train an analysis model to recognize patterns and similarities among data items. This can be used to cluster data items.

The analysis model of the control system 110 can be trained with an unsupervised machine learning process to recognize patterns within audio signals that indicate arcing within the cleanroom environment 102. After training, the analysis model can be used to group audio signals sounds that are similar to each other. This can be used to cluster audio sounds into arcing and non-arcing audio signals.

As the control system 110 receives audio signals, the audio signals may be filtered or formatted and then provided to the analysis model. The analysis model analyzes the audio signals and determines whether a portion of an audio signal represents arcing within the cleanroom environment 102. The analysis model outputs an indication of arcing or no arcing for each audio signal sample passed through the analysis model.

The control system 110 can utilize pattern recognition systems other than a machine learning analysis model in order to detect arcing based on the audio signals. A rules based analysis model is encoded, by an expert, with rules that define how data items should be analyzed and classified. Thus, rather than training an analysis model with a machine learning process, a rules-based analysis model may be encoded to classify data items based on predetermined rules. The analysis model of the control system 110 can utilize a rules based system to recognize arcing sounds. The control system 110 can utilize rules-based analysis systems or other types of analysis systems in order to identify time domain or frequency domain patterns or characteristics indicative of arcing within the clean environment 102.

In one embodiment, when the control system 110 identifies arcing within the cleanroom environment 102, the control system 110 can take various real-time actions responsive to the arcing. Actions can be taken by the control system 110 in order to reduce or otherwise manage the arcing within the cleanroom environment 102 in real time.

In one embodiment, the control system 110 can determine whether or not the arcing is at a level that is dangerous to the semiconductor wafer 104. If the arcing is at a level that is not yet dangerous to the semiconductor wafer 104, the control system 110 may refrain from taking any corrective action. Alternatively, or additionally, the control system 110 may output a notification indicating non-dangerous levels of arcing within the cleanroom environment 102. The notification can be received and viewed by personnel that oversee semiconductor processes within the clean environment 102.

In one embodiment, the control system 110 can determine that the level of arcing is dangerous. In this case, the control system 110 can take steps to reduce or avoid further arcing within the cleanroom environment 110. The control system 110 can be communicatively coupled to the semiconductor process system 106 or to equipment associated with the semiconductor process system 106. The control system 110 can control the semiconductor process 106 to adjust parameters associated with the semiconductor process in order to reduce or avoid further arcing within the cleanroom environment 102.

In one example, the semiconductor process is a plasma based process such as plasma etching, or plasma enhanced chemical vapor deposition or plasma enhanced physical vapor deposition. The semiconductor process system 106 can include equipment that performs or facilitates the plasma based process. The control system 110 can cause the semiconductor process system 106 to adjust parameters of the plasma based process. For example, plasma-based processes often apply high voltages within the cleanroom environment 102 or to gases that enter into the clean environment 102. The control system 110 can cause a reduction in these voltages in order to reduce or eliminate dangerous arcing within the cleanroom environment 102. Alternatively, the control system 110 can adjust other parameters of the plasma based semiconductor process in order to reduce or eliminate dangerous arcing within the cleanroom environment 102.

In one example, arcing may occur between a wall of the cleanroom environment 102 and other equipment or material within the cleanroom environment 102. The arcing may be due to the buildup of dielectric material on a wall or on the equipment within the cleanroom environment 102. The control system 110 can cause an automated system to clean or otherwise remove dielectric material from portions of the clean environment 102 associated with the arcing. This can help reduce arcing.

In one example, arcing may occur based, in part, on temperatures or deposition rates during various semiconductor processes. The control system 110 can reduce temperatures or adjust deposition rates within the clean environment 102 responsive to detecting arcing.

In one example, arcing may occur based, in part, on the concentrations of various types of gases within the cleanroom environment 102 during semiconductor processes. The control system 110 can cause the semiconductor process system 106 to adjust the flow of one or more gases in the cleanroom environment 102 in order to reduce or avoid dangerous arcing.

In one embodiment, the control system 110 may cause the semiconductor process system 106 to entirely stop a semiconductor process in response to detecting arcing within the cleanroom environment 102. In order to avoid serious damage to the semiconductor wafer 104, in some cases the control system 110 may determine that the best course of action is to stop the semiconductor process entirely until other adjustments can be made to reduce or prevent arcing within the clean environments 102.

Figure 2:
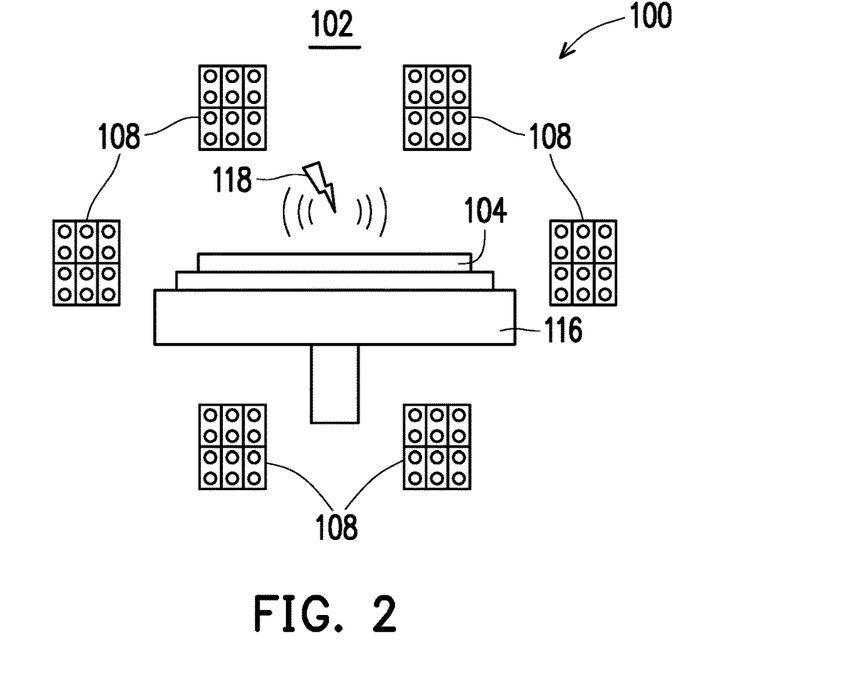
FIG. 2 is an illustration of an arcing detection system, according to one embodiment.

FIG. 2 is an illustration of an arcing detection system 100, according to an embodiment. The arcing detection system 100 includes a semiconductor wafer 104 positioned on a wafer support 116 within the cleanroom environment 102. A plurality of microphones 108 are positioned within the cleanroom environment 102. The arcing detection system 100 detects arcing within the cleanroom environment 102.

The microphones 108 are positioned throughout the cleanroom environment 102. The microphones 108 are positioned laterally around the semiconductor wafer 104 and the wafer support 116. The microphones 108 are also positioned above the semiconductor wafer 104 and below the wafer support 116. Though not illustrated in FIG. 2, one or more of the microphones 108 can also be positioned in contact with the wafer support 116 or other equipment within the clean environment 102.

In one embodiment, each microphone 108 shown in FIG. 2 can correspond to a group of microphones. Each group of microphones can include microphones that are sensitive to sounds in different frequency ranges. For example, each group of microphones may include one or more microphones that are sensitive to infrasonic sounds. Each group of microphones may include one or more microphones that are sensitive to audible sounds. Each group of microphones may include one or more microphones that are sensitive to ultrasonic sounds. Additionally, or alternatively, each group of microphones may include microphones that face in different directions.

In the illustration of FIG. 2, an arcing event 118 is occurring at a particular area of the semiconductor wafer 102. Each of the microphones 108 receives sound waves resulting from the arcing event 118. Each of the microphones 108 generates audio signals based on the sound waves. The microphones 108 can pass the audio signals to a control system 110 (not shown in FIG. 2). The control system 110 can detect the arcing event 118 based on the audio signals. The control system 110 can also identify the location of the arcing event 118 based on the audio signals and the known positions of the microphones 108.

In the example of FIG. 2, the arcing event 118 has contacted a particular portion of the semiconductor wafer 104. The control system 110 can identify the location of the arcing event 118 on the semiconductor wafer 104. The control system can determine that the arcing event contacted the semiconductor wafer because the analysis model can be trained to recognize the sound of arcing that contacts a semiconductor wafer. The control system can determine the location of the arcing event by analyzing the audio signals from each of a plurality of microphones with known positions. The location of origination of a sound can be determined by the strengths of the corresponding audio signals from each microphone. The location of the arcing event 118 will correspond to a particular part of the semiconductor wafer 104. The particular location corresponds to one or more integrated circuit dies that will be separated from the semiconductor wafer 104. The control system 110 can flag the individual integrated circuits that will come from this area of the semiconductor wafer 104 as being potentially damaged. These integrated circuit dies can be discarded after dicing.

In one embodiment, the control system 110 can determine that the arcing event 118 likely caused significant damage to the semiconductor wafer 104 based on the characteristics of the audio signals. The control system 110 can output an alert that a technician should inspect the semiconductor wafer 104. Alternatively, the control system can determine that the semiconductor wafer 104 should be discarded.

In one embodiment, the sound waves of an arcing event are different depending on various factors associated with the arcing event. For example, soundwaves associated with an arcing event can vary based on a type of gas present within the cleanroom environment 102 during thin-film growth or deposition process related to the semiconductor wafer 104. Arcing audio patterns can vary with process parameters such as a voltage present within the cleanroom environment 102 or a level of vacuum within the cleanroom environment 102. Arcing audio patterns can vary with the type of semiconductor process including wet etches, dry etches, physical vapor deposition, chemical vapor deposition, or other types of processes. Arcing audio patterns can vary based on the type of material that has been damaged, such as an oxide layer, a photoresist layer, a metal layer, a semiconductor layer, or other types of materials associated with the semiconductor wafer 104. Arcing audio patterns can vary based on the type of damage such as the size of a damaged area, the shape of a damaged area, or other factors associated with a damage result. Arcing audio patterns can vary based on the occurrence of chipping of the semiconductor wafer 104 or other structures or equipment positioned within the cleanroom environment 102.

The control system 110 can be trained to recognize sound patterns associated with all the various parameters of arcing events. The control system 110 can make diagnoses and can adjust parameters of semiconductor processes based on the particular sound patterns associated with the various types of arcing events.

In one embodiment, the control system 110 can sense whether an arcing event has contacted the wafer support 116. The control system 110 can sense a location on the wafer support 116 that was affected by an arcing event. The location can be detected based on the audio signals and the known positions of the microphones 108. The control system 110 can detect arcing and location of arcing in other locations and relative to other materials or equipment positioned within the cleanroom environment 102.

Though not shown in FIG. 2, each microphone 108, or group of microphones, can be coupled to additional circuitry including wired or wireless communication devices, power sources, energy harvesting devices, filters, signal processors, or other electronic circuitry that can assist in the detection of arcing in the cleanroom environment 102.

Figure 3:
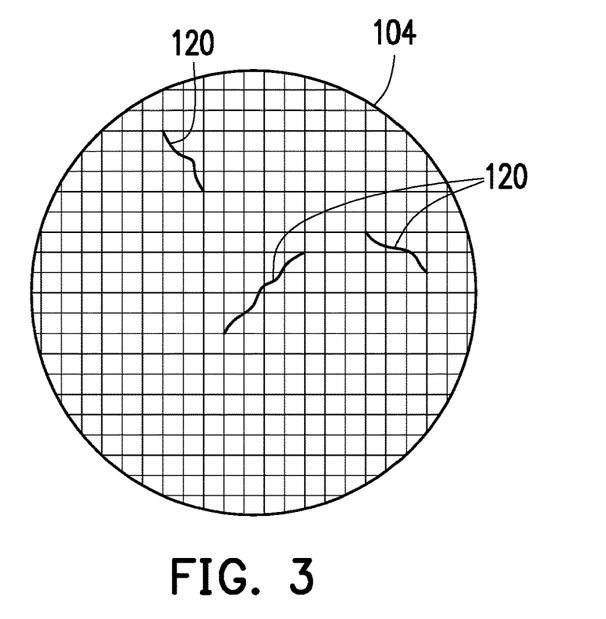
FIG. 3 is a representation of a semiconductor wafer indicating locations that have sustained arcing events, according to one embodiment.

FIG. 3 is a representation of a semiconductor wafer 104 indicating locations that have sustained arcing events, according to one embodiment. The control system 110 detects arcing events and their locations on a semiconductor wafer 104. The control system 110 records the locations of the arcing events on the semiconductor wafer 104.

The representation of the semiconductor wafer 104 shown in FIG. 3 includes a plurality of dashed lines. The dashed lines represent dicing lines along which the semiconductor wafer 104 will be diced. Accordingly, the dashed lines outline individual integrated circuit dies that will result when the semiconductor wafer 104 is diced.

The representation of the semiconductor wafer 104 shown in FIG. 3 includes arcing indicators 120. The arcing indicators 120 illustrate the locations of arcing events on the semiconductor wafer 104. Accordingly, the arcing indicators 120 indicate portions of the semiconductor wafer 104 that have been affected by arcing events.

The arcing indicators 120 extend across various integrated circuit dies that will result from dicing the semiconductor wafer 104. The control system 110 can record which integrated circuit dies are affected by the arcing events based on the locations of the arcing indicators 120. These affected integrated circuit dies can be discarded after dicing. Alternatively, the affected integrated circuit dies can be subjected to additional testing before after dicing.

Figure 4:
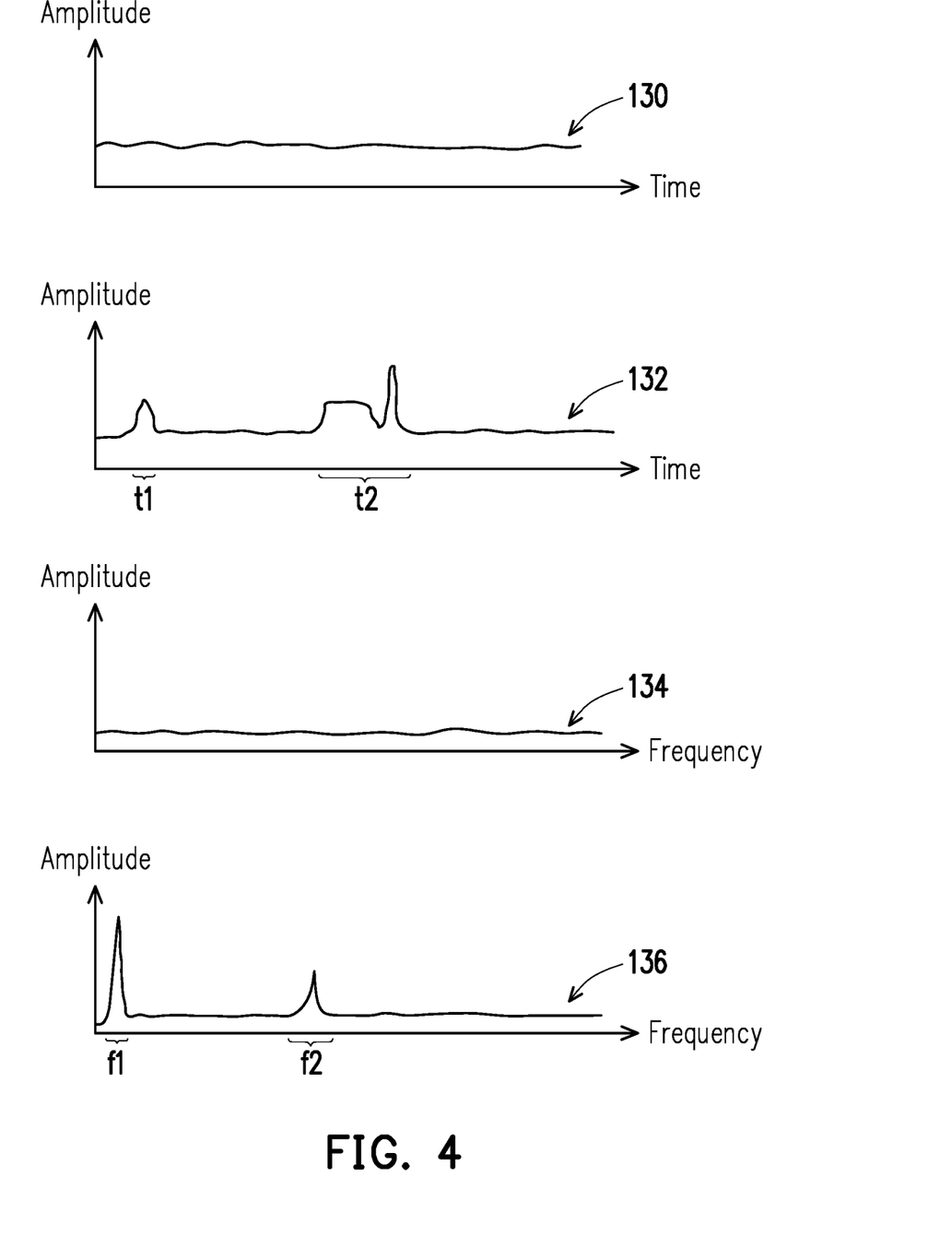
FIG. 4 illustrates a plurality of graphs associated with audio signals generated by microphones of an arcing detection system, according to one embodiment.

FIG. 4 illustrates a plurality of graphs 130, 132, 134, and 136 associated with audio signals generated by microphones 108 of an arcing detection system 100, according to one embodiment. The graph 130 is a time domain graph of audio signals recorded by microphones 108 in a clean environment 102 during a period that did not include any arcing. The graph 130 is a graph of the amplitude of soundwaves versus time. The control system 110 is trained or otherwise configured to recognize that the waveform of the graph 130 represents a period with no arcing. The lack of arcing is reflected by the relatively constant noise level.

The graph 132 is a time domain graph of audio signals recorded by microphones 108 in a cleanroom environment 102 during a period that included arcing within the cleanroom environment 102. The graph 132 is a graph of amplitude of soundwaves versus time. The graph 132 has a pattern that differs from the graph 130. The control system 110 is trained or otherwise configured to recognize that the waveform of the graph 132 corresponds to a period during which arcing occurred. The arcing sounds correspond to the protruding audio features at time frames t1 and t2 in graph 132. In practice, arcing sounds may have features different than those shown in graph 132.

The graph 134 is a frequency domain graph of audio signals recorded by microphones 108 in a cleanroom environment 102 during a period that did not include arcing within the cleanroom environment 102. The graph 134 is a graph of the amplitude of soundwaves versus frequency. The control system 110 is trained or otherwise configured to recognize that the waveform of the graph 134 represents a period with no arcing. The lack of arcing is reflected by the lack of distinct peaks in frequency.

The graph 136 is a frequency domain graph of audio signals recorded by microphones 108 in the cleanroom environment 102 during a period that included arcing within the cleanroom environment 102. The graph 136 is a graph of the amplitude of soundwaves versus frequency. The control system 110 is trained or otherwise configured to recognize that the waveform of the graph 136 represents a period in which arcing occurred. The arcing sounds correspond to the peaks at frequency ranges f1 and f2. In practice, arcing sounds may have features different than those shown in graph 136.

Figure 5:
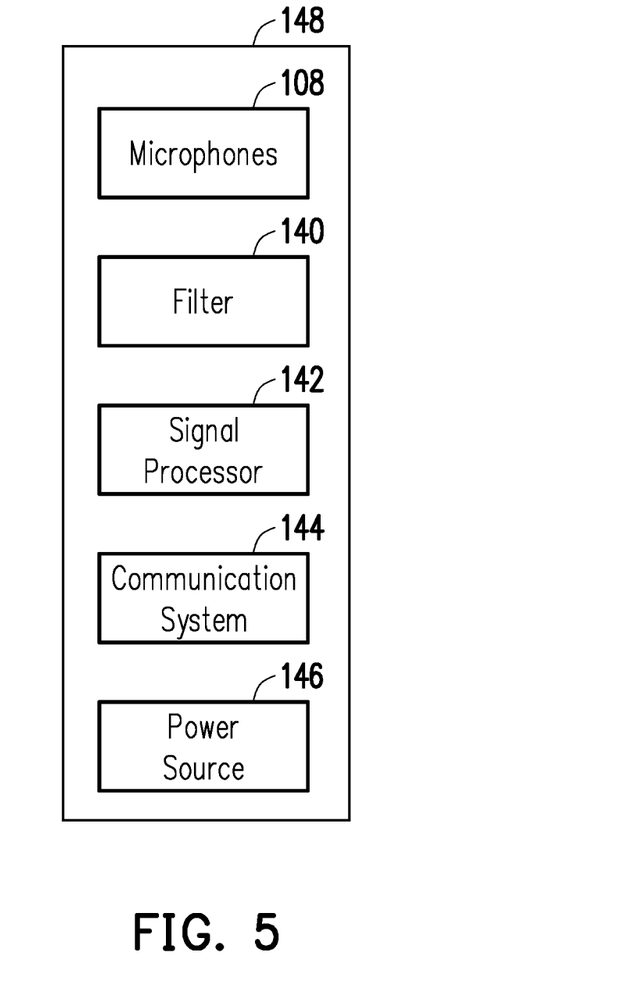
FIG. 5 is a block diagram of audio signal output circuitry of an arcing detection system, according to one embodiment.

FIG. 5 is a block diagram of audio signal output circuitry 148 of an arcing detection system 100, according to an embodiment. The audio signal output circuitry 148 includes one or more microphones 108, a filter 140, a signal processor 142, a communication system 144, and a power source 146, according to one embodiment. The audio signal output circuitry 148 can correspond to a circuitry package positioned within a cleanroom environment 102.

With reference to FIGS. 1 and 2, an arcing detection system 100 includes a plurality of microphones 108 positioned within the cleanroom environment 102. In one embodiment, the arcing detection system 100 can include, in the place of each microphone 108 or group of microphones 108, a respective audio signal output circuitry 148. Thus, each microphone 108 or group of microphones 108 as part of a respective audio signal output circuitry 148.

Each microphone or group of microphones receives sound signals, generates audio signals and passes the audio signals to a filter 140. The filter 140 filters noise from the audio signals and passes the filtered audio signals to the signal analyzer 142. The signal processor 142 processes the audio signals, for example by digitizing the audio signals, and provides the audio signals to the communication system 144. The communication system 144 outputs the audio signals to the control system 110. The communication system 144 can include a wireless communication system or a wired communication system. The power source 146 powers the audio signal output circuitry 148. The power source 146 can include an energy harvesting device. Though not shown in FIG. 5, portions of the control system 110 can be included in the audio signal output circuitry 148. The audio output circuitry 148 can include other components or configurations without departing from the scope of the present disclosure.

Figure 6:
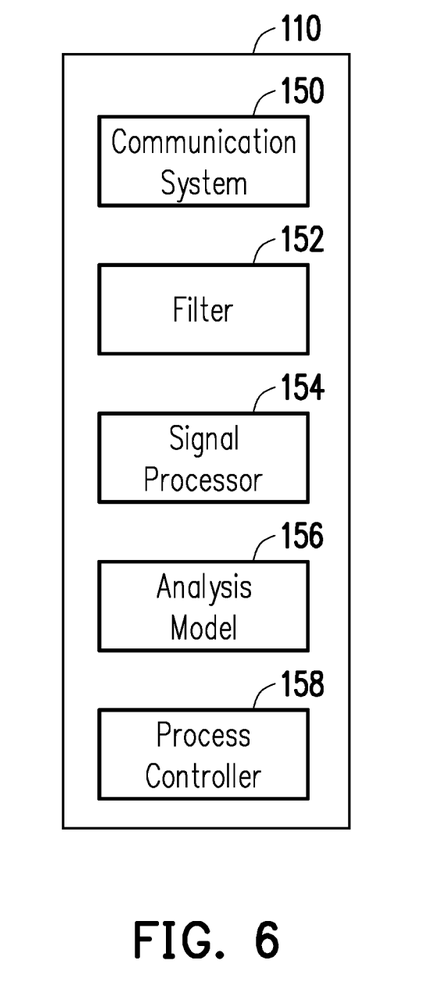
FIG. 6 is a block diagram of a control system of an arcing detection system, according to one embodiment.

FIG. 6 is a block diagram of a control system 110 of an arcing detection system 100, according to an embodiment. The control system 110 includes a communication system 150, a filter 152, a signal processor 154, an analysis model 156, and a process controller 158.

The communication system 150 communicates with the microphones 108, or with the audio signal output circuitry 148. The communication system 150 can include a wireless communication system that communicates wirelessly with the audio signal output circuitry 148. The communication system 150 can include a wired communication system that communicates with the audio signal output circuitry 148 via a wired connection. The communication system 150 receives audio signals from the microphones 108.

The communication system 150 provides the audio signals to the filter 152. The filter 152 can filter out background noise from the audio signals. The filter 152 can also filter out selected frequency bands from the audio signals. The control system 110 can include multiple filters 152.

The signal processor 154 receives the audio signals from the filter 152. The signal processor 154 processes the audio signals. The signal processor 154 can generate time domain representations of the audio signals. The signal processor 154 can generate frequency domain representations of the audio signals, as described previously. The signal processor 154 can place the audio signals into a format that can be utilized by the analysis model 156.

The analysis model 156 analyzes the audio signals and determines whether the audio signals indicate that arcing has occurred within the cleanroom environment 102. The analysis model 126 can be trained with a machine learning process as described previously in relation to FIG. 1. The machine learning process can train the analysis model 126 to identify various types of arcing within the cleanroom environment based on the audio signals.

The process controller 158 communicates with and controls the semiconductor process system 106. For example, if the analysis model 156 indicates that arcing is present within the clean environment 102, then the process controller 158 can cause the semiconductor process system 106 to adjust a semiconductor process in real time. The process controller 158 can also cause the semiconductor process system 106 to stop a semiconductor process responsive to the detection of arcing within the cleanroom environment 102.

Figure 7:
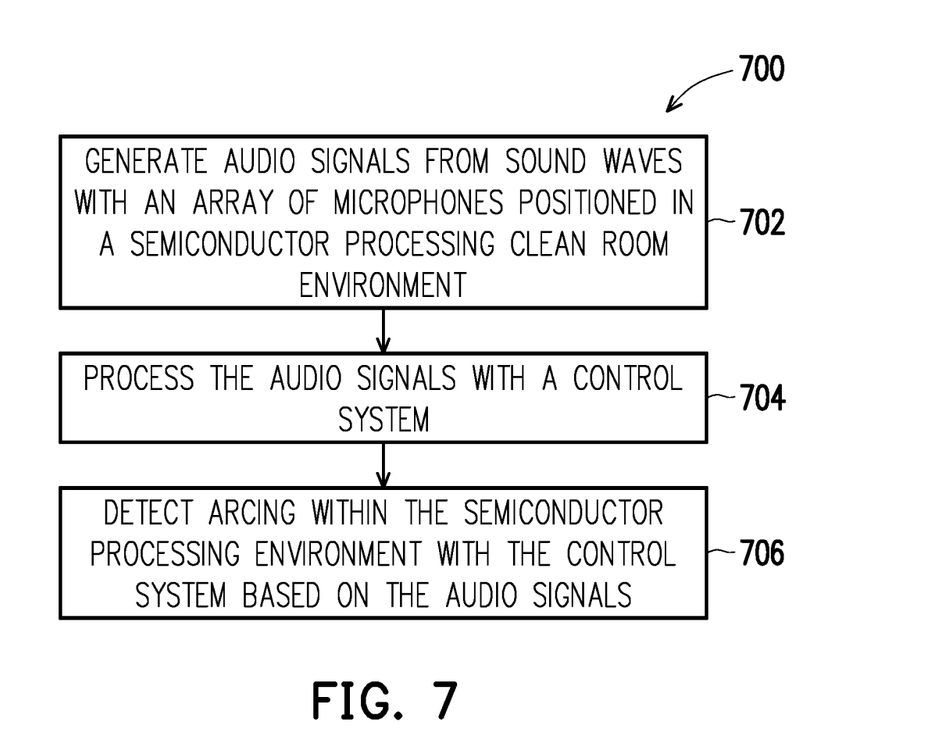
FIG. 7 is a flow diagram of a method for detecting arcing within a semiconductor cleanroom environment, according to one embodiment.

The control system 110 can include components and systems positioned within the cleanroom environment 102 as well as components positioned external to the cleanroom environment 102. Those of skill in the art will recognize, in light of the present disclosure, that a control system 110 can include other components and systems, or other configura- FIG. 7 is a flow diagram of a method 700 for detecting arcing within a semiconductor cleanroom environment, according to an embodiment. At 702, the method generates audio signals from sound waves with an array of microphones positioned in a semiconductor processing cleanroom environment. One example of an array of microphones is the microphones 108 of FIG. 1. One example of a semiconductor processing cleanroom environment is the cleanroom environment 102 of FIG. 1. At 704, the method 700 includes processing the audio signals with a control system. One example of a control system 110 is the control system 110 of FIG. 1. At 706, the method 700 includes detecting arcing within the semiconductor processing environment with the control system based on the audio signals.

Figure 8:
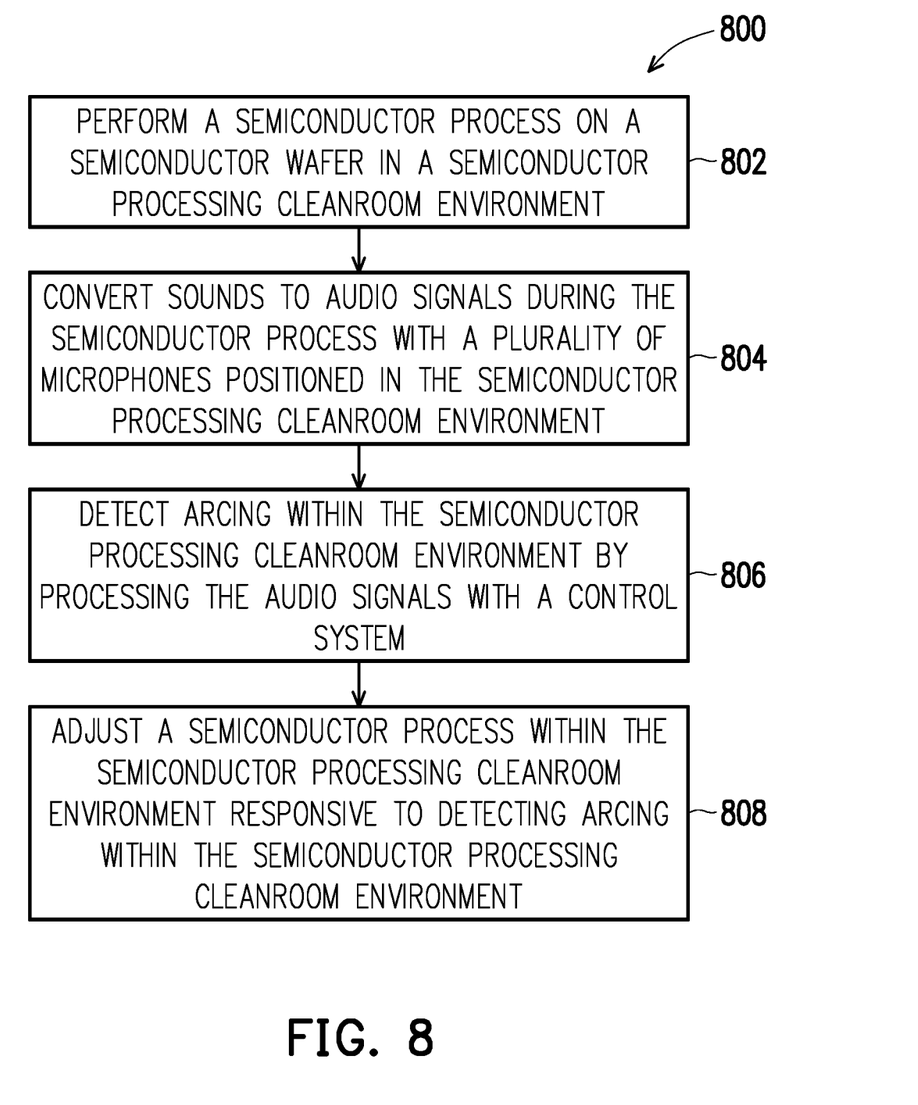
FIG. 8 is a flow diagram of a method for detecting arcing within a semiconductor cleanroom environment, according to one embodiment.

FIG. 8 is a flow diagram of a method 800 for detecting arcing within a semiconductor cleanroom environment, according to an embodiment. At 802 the method 800 includes performing a semiconductor process on a semiconductor wafer in a semiconductor processing cleanroom environment. One example of a semiconductor wafer is the semiconductor wafer 104 of FIG. 1. One example of a semiconductor processing cleanroom environment is the cleanroom environment 102 of FIG. 1. At 804 the method 800 includes converting sounds to audio signals during the semiconductor process with a plurality of microphones positioned in the semiconductor processing cleanroom environment. One example of an array of microphones is the microphones 108 of FIG. 1. At 806 the method includes detecting arcing within the semiconductor processing cleanroom environment by processing the audio signals with a control system. One example of a control system 110 is the control system 110 of FIG. 1. At 808, the method includes adjusting a semiconductor process within the semiconductor processing cleanroom environment responsive to detecting arcing within the semiconductor processing cleanroom environment.

In one embodiment, a method includes generating audio signals from sound waves with an array of microphones positioned in a semiconductor processing cleanroom environment. The method includes processing the audio signals with a control system. The method includes detecting arcing within the semiconductor processing environment with the control system based on the audio signals.

In one embodiment, a method includes performing a semiconductor process on a semiconductor wafer in a semiconductor processing cleanroom environment and converting sounds to audio signals during the semiconductor process with a plurality of microphones positioned in the semiconductor processing cleanroom environment. The method includes detecting arcing within the semiconductor processing cleanroom environment by processing the audio signals with a control system. The method includes adjusting a semiconductor process within the semiconductor processing cleanroom environment responsive to detecting arcing within the semiconductor processing cleanroom environment.

In one embodiment, a system includes a plurality of microphones positioned within a semiconductor processing cleanroom environment and configured to detect sounds within the semiconductor processing cleanroom environment and to generate audio signals based on the sounds. The system includes a control system communicatively coupled to the plurality of microphones and configured to detect arcing within the semiconductor processing cleanroom environment based on the audio signals.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
   performing a semiconductor process on a semiconductor wafer positioned in a semiconductor processing cleanroom environment;
   generating audio signals from sound waves with an array of microphones positioned in the semiconductor processing cleanroom environment, wherein the array of microphones includes a plurality of groups of microphones, wherein each group of microphones includes a first microphone sensitive to sounds in a first frequency range including infrasonic sound, a second microphone sensitive to sounds in a second frequency range different than the first frequency range and including audible frequencies, and a third microphone sensitive to sounds in a third frequency range different than the first and second frequency ranges and including ultrasonic frequencies, wherein the first microphone is not sensitive to at least a portion of the second frequency range and the third frequency range, wherein the second microphone is not sensitive to at least a portion of the first and third frequency ranges, wherein the third microphone is not sensitive to at least a portion of the first and second frequency ranges;
   filtering, with a plurality of first filters each coupled to a respective group of microphones, the audio signals;
   processing the audio signals with a control system, wherein processing the audio signals includes filtering one or more frequency bands from the audio signals with at least one second filter;
   detecting arcing within the semiconductor processing cleanroom environment with the control system based on the audio signals;
   determining, with the control system, whether the arcing is dangerous to the semiconductor wafer;
   if the control system determines that the arcing is dangerous:
     adjusting, with the control system, parameters of the semiconductor process responsive to detecting the arcing; and
     continuing the semiconductor process with adjusted parameters after detecting the arcing without stopping the semiconductor process; and
   if the control system determines that the arcing is not dangerous, continuing performing the semiconductor process without adjusting parameters of the semiconductor process.

2. The method of claim 1, wherein processing the audio signals includes performing time domain analysis on the audio signals.

3. The method of claim 1, wherein processing the audio signals includes performing frequency domain analysis on the audio signals.

4. The method of claim 3, wherein performing frequency domain analysis includes performing one or more of:
a fourier transform; and
wavelet analysis.

5. The method of claim 1, wherein detecting arcing includes determining that the audio signals correspond to audio characteristics of arcing.

6. The method of claim 1, further comprising determining a location of the arcing within the semiconductor processing cleanroom environment based on the audio signals and positions of the microphones within the semiconductor processing cleanroom environment.

7. The method of claim 1, wherein adjusting the semiconductor process includes one or more of:
adjusting a flow of one or more gasses into the semiconductor processing cleanroom environment;
adjusting a pressure within the semiconductor processing cleanroom environment; and
adjusting a voltage or electric field applied within the semiconductor processing cleanroom environment.

8. The method of claim 1, further comprising:
training an analysis model of the computing system with a machine learning process to detect arcing within the semiconductor processing cleanroom environment; and
detecting the arcing by analyzing the audio signals with the analysis model.

9. The method of claim 1, further comprising detecting whether the arcing contacted the semiconductor wafer within the semiconductor processing cleanroom environment.

10. The method of claim 9, further comprising identifying a location of the arcing on the semiconductor wafer.

11. The method of claim 1, wherein the determining whether the arcing is dangerous includes determining, with the control system, whether the arcing has damaged the semiconductor wafer.

12. The method of claim 1, comprising filtering noise from the audio signals with the first filters.

13. A system, comprising:
a plurality of microphones positioned within a semiconductor processing cleanroom environment and configured to detect sounds within the semiconductor processing cleanroom environment and to generate audio signals based on the sounds, wherein the plurality of microphones includes a plurality of groups of microphones, wherein each group of microphones includes a first microphone sensitive to sounds in a first frequency range including infrasonic frequencies, a second microphone sensitive to sounds in a second frequency range different than the first frequency range and including audible frequencies, and a third microphone sensitive to sounds in third frequency range different than the first and second frequency ranges and including ultrasonic frequencies, wherein the first microphone is not sensitive to at least a portion of the second frequency range and the third frequency range, wherein the second microphone is not sensitive to at least a portion of the first and third frequency ranges, wherein the third microphone is not sensitive to at least a portion of the first and second frequency ranges;
a plurality of first filters each coupled to a respective group of microphones; and
a control system communicatively coupled to the plurality of microphones and configured to detect arcing during a semiconductor process within the semiconductor processing cleanroom environment based on the audio signals, wherein the control system is configured to:
determine whether the arcing is dangerous to a semiconductor wafer undergoing a semiconductor process within the semiconductor processing cleanroom environment;
if the control system determines that the arcing is dangerous, adjust the semiconductor process responsive to detecting the arcing and without stopping the semiconductor process; and
if the control system determines that the arcing is not dangerous, continue performing the semiconductor process without adjusting parameters of the semiconductor process, wherein the control system includes a second filter configured to filter one or more frequency bands from the audio signals.

14. The system of claim 13, wherein the control system includes an analysis model trained with a machine learning process to recognize arcing based on the audio signals.

15. The system of claim 13, wherein the plurality of microphones are arranged to enable the control system to determine a location of arcing within the semiconductor processing cleanroom environment based the on audio signals.

16. The system of claim 13, further comprising a wireless communication system communicatively coupling the microphones to the control system.

17. A method, comprising:
performing a semiconductor process on a semiconductor wafer in a semiconductor processing cleanroom environment;
converting sounds to audio signals during the semiconductor process with a plurality of microphones positioned in the semiconductor processing cleanroom environment, wherein the array of microphones includes a plurality of groups of microphones, wherein each group of microphones includes a first microphone sensitive to sounds in a first frequency range including infrasonic frequencies, a second microphone sensitive to sounds in a second frequency range different than the first frequency range and including audible frequencies, and a third microphone sensitive to sounds in third frequency range different than the first and second frequency ranges and including ultrasonic frequencies, wherein the first microphone is not sensitive to at least a portion of the second frequency range and the third frequency range, wherein the second microphone is not sensitive to at least a portion of the first and third frequency ranges, wherein the third microphone is not sensitive to at least a portion of the first and second frequency ranges;
filtering, with a plurality of first filters each coupled to a respective group of microphones, the audio signals;
detecting, with a control system, arcing within the semiconductor processing cleanroom environment by processing the audio signals with a control system, wherein the control system includes a second filter configured to filter one or more frequency bands from the audio signals;
if the control system determines that the arcing is likely to have damaged the semiconductor wafer, adjusting the semiconductor process within the semiconductor processing cleanroom environment responsive to detecting arcing within the semiconductor processing cleanroom environment without interrupting the semiconductor process;

if the control system determines that the arcing is not likely to have damaged the semiconductor wafer, continuing performing the semiconductor process without adjusting the semiconductor process.

18. The method of claim 17, wherein processing the audio signals includes processing digital or analog signals generated from the audio signals.

19. The method of claim 18, further comprising determining, with the control system, whether the arcing has damaged the semiconductor wafer.

20. The method of claim 17, comprising filtering noise from the audio signals with the first filters.

\* \* \* \* \*